US005511236A

United States Patent [19]
Umstattd et al.

[11] Patent Number: 5,511,236
[45] Date of Patent: Apr. 23, 1996

[54] HALF DUPLEX RF TRANSCEIVER

[75] Inventors: Ruth Umstattd, Santa Clara; Benny Madsen, San Diego, both of Calif.

[73] Assignee: National Semiconductor Corporation, Santa Clara, Calif.

[21] Appl. No.: 291,876

[22] Filed: Aug. 17, 1994

Related U.S. Application Data

[63] Continuation-in-part of Ser. No. 163,671, Dec. 7, 1993, abandoned.

[51] Int. Cl.$^6$ ..................................................... H04B 1/40
[52] U.S. Cl. .................. 455/76; 455/85; 455/86; 455/315; 455/324; 329/325; 332/127; 375/327
[58] Field of Search ........................ 455/76, 78, 84, 455/85, 86, 119, 126, 314, 315, 316, 329, 324, 337; 329/323, 325; 331/12, 2; 332/103, 127, 128; 375/7, 80, 81

[56] References Cited

U.S. PATENT DOCUMENTS

| | | | |
|---|---|---|---|
| 4,021,757 | 5/1977 | Nossen . | |
| 4,513,447 | 4/1985 | Carson | 455/86 |
| 5,079,526 | 11/1992 | Heck | 329/325 |
| 5,123,008 | 6/1992 | Beesby | 455/86 |
| 5,150,082 | 9/1992 | Grimmett et al. . | |
| 5,230,088 | 7/1993 | Kramer, Jr. et al. | 455/76 |
| 5,259,007 | 11/1993 | Yamamoto . | |
| 5,276,915 | 1/1994 | Marko et al. | 455/86 |
| 5,313,173 | 5/1994 | Lampe | 332/103 |
| 5,319,799 | 6/1994 | Morita | 455/78 |
| 5,323,125 | 6/1994 | Hiben et al. . | |
| 5,327,582 | 7/1994 | Wong | 455/76 |
| 5,355,513 | 10/1994 | Clarke et al. . | |
| 5,392,460 | 2/1995 | Mattila et al. | 455/86 |

FOREIGN PATENT DOCUMENTS

| | | |
|---|---|---|
| 0209754 | 1/1987 | European Pat. Off. . |
| 0333419 | 3/1989 | European Pat. Off. . |
| 1161206 | 8/1969 | United Kingdom . |
| 2188212 | 9/1987 | United Kingdom . |
| 2260044 | 3/1993 | United Kingdom . |
| WO 92/22147 | 12/1992 | WIPO . |

OTHER PUBLICATIONS

Scott Grimmett, "Frequency Modulation in a Phase Lock Loop by Control of the Phase Inside the Loop", Frequency Synthesis Handbook–A Collection from RF Design, Cardiff Publishing Company, Jun. 1991, pp. 70–73.

*Primary Examiner*—Andrew I. Faile
*Attorney, Agent, or Firm*—Limbach & Limbach

[57] ABSTRACT

A radio frequency (RF) transceiver for modulating and demodulating RF signals with a direct modulation transmitter and a dual intermediate frequency (IF) receiver, respectively, includes a local oscillator, three frequency converters, a demodulator, a carrier generator, a modulator, a controller and two signal switches. The local oscillator (e.g. phase lock loop [PLL]) provides a first local oscillator (LO) signal. One frequency converter (e.g. mixer) frequency converts an incoming modulated RF signal with the first LO signal to provide a first modulated IF signal. A second frequency converter frequency converts the first modulated IF signal with a second LO signal to provide a second modulated IF signal. The demodulator also receives the second LO signal and demodulates therewith the second modulated IF signal. The carrier generator (e.g. voltage-controlled oscillator [VCO]) receives a transmitter control signal and in accordance therewith generates a transmitter carrier signal. The third frequency converter receives the transmitter carrier signal and the first LO signal and in response thereto provides the second LO signal. The modulator selectively receives and modulates the second LO signal to provide a third modulated IF signal. The controller (e.g. phase detector) receives a reference signal and selectively receives the second LO signal and the third modulated IF signal and in response thereto provides the transmitter control signal. The signal switches receive a mode control signal and in response to one state thereof connect the controller to the third frequency converter and in response to another state thereof connect the modulator to both the third frequency converter and controller.

43 Claims, 3 Drawing Sheets

| Xtal 39 MHz | | Rx IF | Tx IF | Rx VCO | Extended Range | Tx VCO | Extended Range | R | N | PD Freq. | PD Gain (Kp) |
|---|---|---|---|---|---|---|---|---|---|---|---|
| GSM | Tx | 255 MHz | 208 MHz | 666–701 MHz | 4 MHz | 880–915 MHz | 10 MHz | 3 | 68 | 13 MHz | 0.5mA/2π |
| | Rx | | 204 MHz | 670–705 MHz | | 870–905 MHz | | 13 | 16 | 3 MHz | 2mA/2π |
| | Tx | 225 MHz | 182 MHz | 698–733 MHz | 2 MHz | 880–915 MHz | 2 MHz | 3 | 60 | 13 MHz | 0.5mA/2π |
| | Rx | | 180 MHz | 700–735 MHz | | 878–913 MHz | | 13 | 14 | 3 MHz | 2mA/2π |
| | Tx | 285 MHz | 234 MHz | 634–669 MHz | 6 MHz | 880–915 MHz | 18 MHz | 3 | 18 | 13 MHz | 0.5mA/2π |
| | Rx | | 228 MHz | 640–675 MHz | | 862–897 MHz | | 13 | 76 | 3 MHz | 2mA/2π |
| DCS1800 | Tx | 255 MHz | 208 MHz | 1546–1621 MHz | 4 MHz | 1710–1785 MHz | 44 MHz | 3 | 68 | 13 MHz | 0.5mA/2π |
| | Rx | | 204 MHz | 1550–1625 MHz | | 1754–1829 MHz | | 13 | 16 | 3 MHz | 2mA/2π |
| | Tx | 225 MHz | 182 MHz | 1578–1653 MHz | 2 MHz | 1710–1785 MHz | 50 MHz | 3 | 60 | 13 MHz | 0.5mA/2π |
| | Rx | | 180 MHz | 1580–1655 MHz | | 1760–1835 MHz | | 13 | 14 | 3 MHz | 2mA/2π |
| | Tx | 285 MHz | 234 MHz | 1514–1589 MHz | 6 MHz | 1710–1785 MHz | 38 MHz | 3 | 18 | 13 MHz | 0.5mA/2π |
| | Rx | | 228 MHz | 1520–1595 MHz | | 1748–1823 MHz | | 13 | 76 | 3 MHz | 2mA/2π |

FIG. 2

HALF DUPLEX RF TRANSCEIVER

RELATED APPLICATION

This is a continuation-in-part of U.S. patent application Ser. No. 08/163,671, filed Dec. 7, 1993, and entitled "Phase/Frequency Modulator" (the disclosure of which is incorporated herein by reference), now abandoned.

BACKGROUND OF THE INVENTION

1. Field of the Invention

The present invention relates to radio frequency (RF) transceivers which operate in a half duplex mode, and in particular, to half duplex RF transceivers whose transmitter and receiver share local oscillator (LO) signal sources.

2. Description of the Related Art

As applications for wireless RF communications technology become more varied and widespread, particularly with respect to mobile communications, two limitations in transceiver design have become increasingly critical: complexity and power supply requirements. With respect to transceiver complexity, mobile and portable applications generally require transceivers to be as small as possible, and therefore, as simple as possible. Further, with respect to power supply requirements, applications for mobile and portable transceivers require such transceivers to be as efficient as possible.

Accordingly, it would be desirable to have an improved RF transceiver design which minimizes circuit complexity and maximizes power efficiency.

SUMMARY OF THE INVENTION

An RF transceiver in accordance with a preferred embodiment of the present invention includes a local oscillator, a dual conversion receiver and a modulated transmitter. The local oscillator (e.g. PLL) provides a first local oscillator (LO) signal for use by both the receiver and transmitter. The receiver uses the first LO signal and a second LO signal for frequency converting and demodulating an incoming modulated RF signal. The transmitter uses the first LO signal, a reference signal and a mode control signal to generate the second LO signal, and uses the first LO signal, the reference signal, the mode control signal and at least one modulation signal for generating an outgoing modulated RF signal.

In accordance with a preferred embodiment of the present invention, the dual conversion receiver includes a dual frequency converter and a demodulator. The dual frequency converter (e.g. serially coupled mixers) frequency converts the incoming modulated RF signal with the first LO signal to produce a first modulated intermediate frequency (IF) signal and then frequency converts the first modulated IF signal with the second LO signal to produce a second modulated IF signal. The demodulator uses the second LO signal also to demodulate the second modulated IF signal.

In further accordance with a preferred embodiment of the present invention, the modulated transmitter includes a carrier generator, a frequency converter, a modulator, a controller and a switchable coupler. The carrier generator (e.g. voltage-controlled oscillator) receives a transmitter control signal and in accordance therewith generates a transmitter carrier signal. The frequency converter (e.g. mixer) uses the transmitter carrier signal and the first LO signal to provide the second LO signal. The modulator selectively receives and modulates the second LO signal to provide a third modulated IF signal. The controller (e.g. phase detector) selectively uses the reference signal, second LO signal and third modulated IF signal to provide the transmitter control signal. The switchable coupler (e.g. RF switches), in response to the mode control signal, couples the controller to the frequency converter and couples the modulator to the frequency converter and to the controller.

BRIEF DESCRIPTION OF THE DRAWINGS

FIG. 2 is a table of suggested frequency plans for a half duplex RF transceiver in accordance with a preferred embodiment of the present invention.

DETAILED DESCRIPTION OF THE INVENTION

Figure 1A:
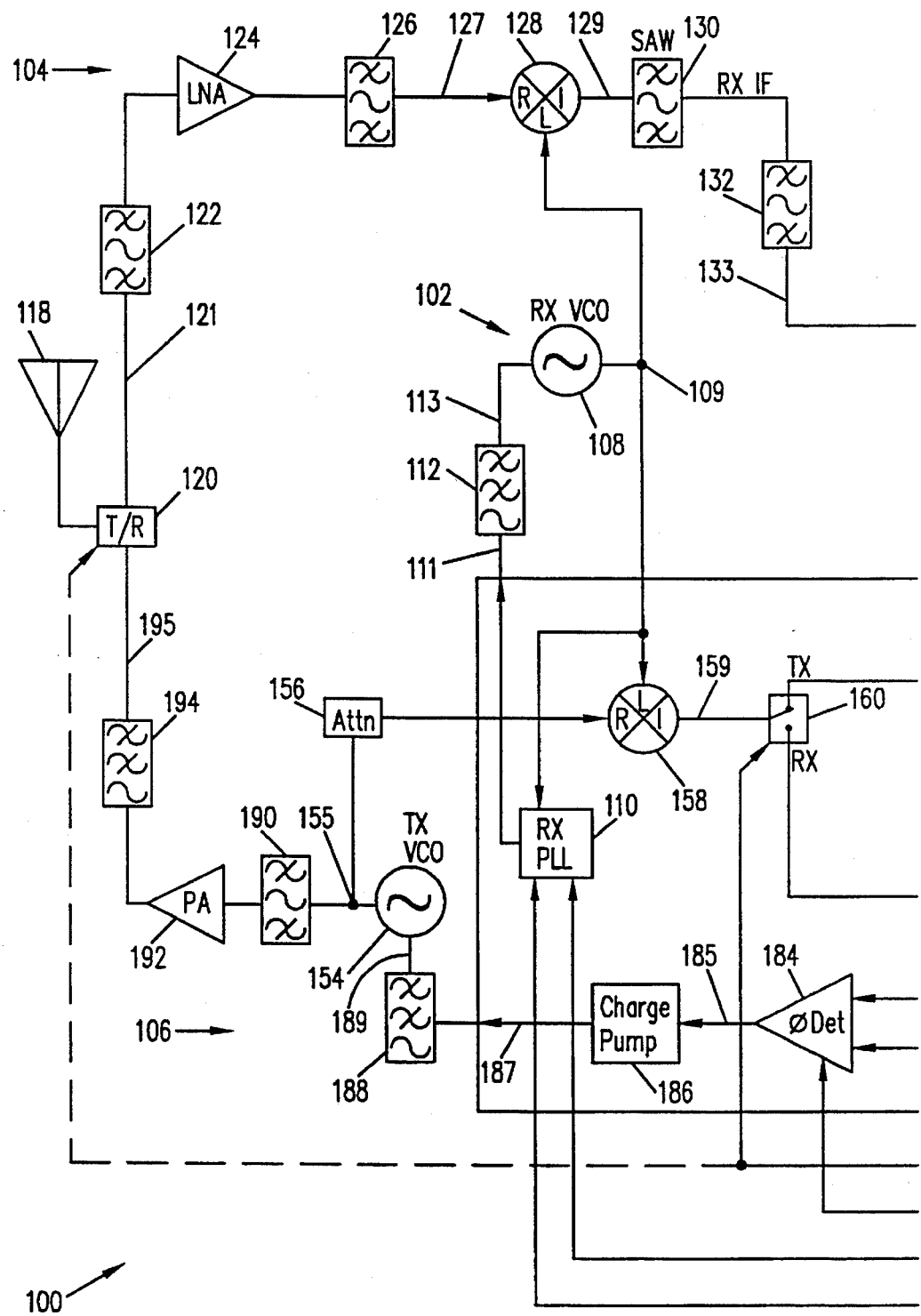
FIG. 1(a–b) is a functional block diagram of a half duplex RF transceiver in accordance with a preferred embodiment of the present invention.
Figure 1B:
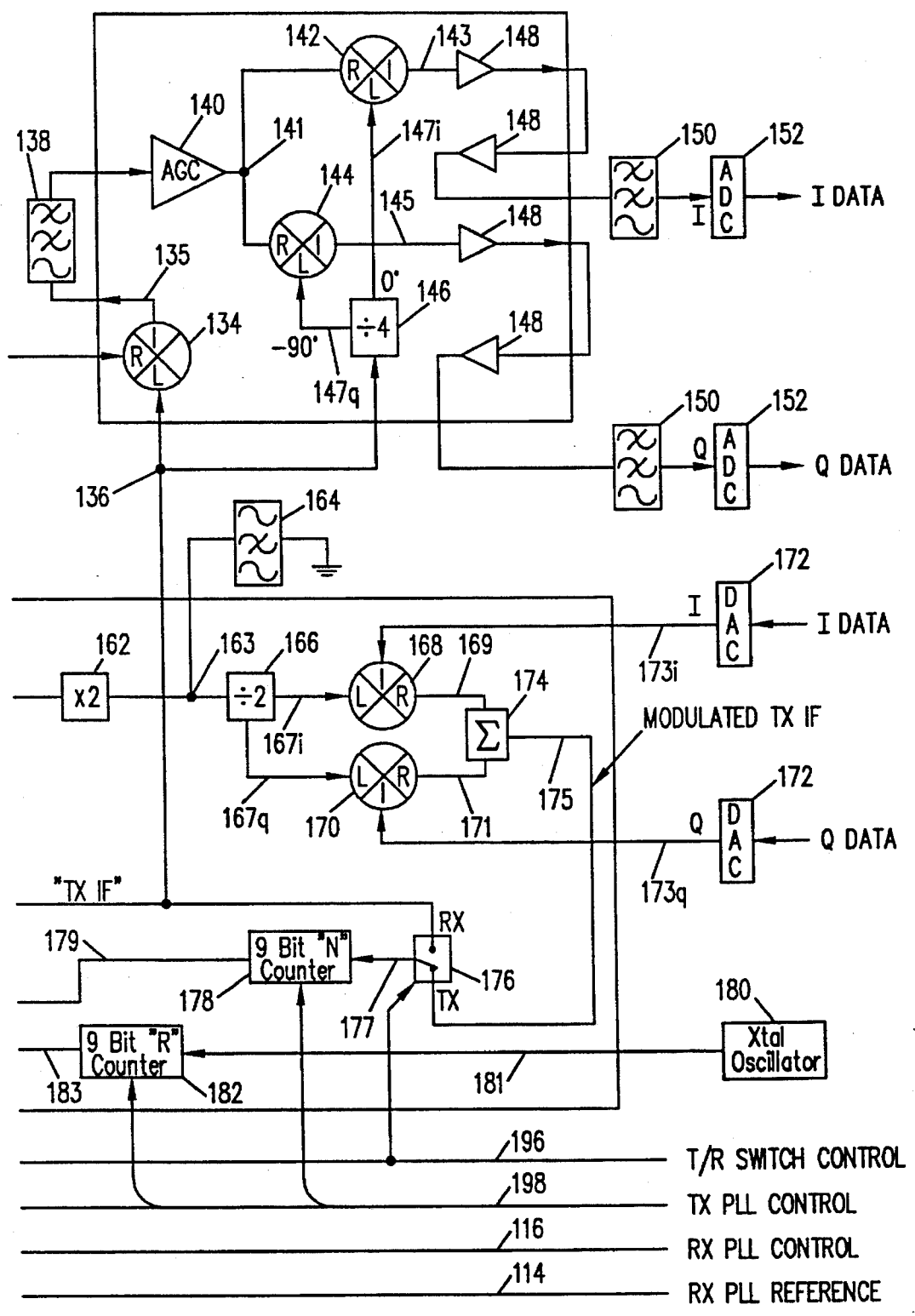

Referring to FIG. 1, a half duplex RF transceiver 100 in accordance with a preferred embodiment of the present invention includes a common LO 102, a receiver 104 and a transmitter 106, substantially as shown. (Although it is used by both the receiver 104 and transmitter 106, the LO 102 is referred to herein as the "receiver LO" or "RX LO" since its output is used directly for frequency conversion within the receiver 104.)

The LO 102 includes a voltage-controlled oscillator (VCO) 108, a phase lock loop (PLL) 110 and a loop filter (lowpass) 112, connected as shown. In accordance with well known PLL principles, the output 109 of the VCO 108 is compared against a reference signal 114 with respect to phase (or frequency). The resulting correction signal 111, representing any phase (or frequency) difference, is filtered by the loop filter 112. This lowpass filtered signal 113 drives the VCO 108, thereby controlling the frequency and phase of its output 109. The PLL 110 is controlled (e.g. programmed) via a PLL control signal 116, thereby allowing the frequency of the VCO output 109 to be selected as desired.

Operation of the receiver 104 can be described as follows. Signals received via the antenna 118 are passed to the receiver 104 by way of a signal routing device 120, such as an RF switch or circulator. This receive signal 121 is filtered by a bandpass filter 122, amplified by a low noise amplifier (LNA) 124 and filtered again by a bandpass image filter 126. This filtered and amplified receive signal 127 is frequency down converted with a mixer 128, using the aforementioned VCO output 109. The resulting first receiver (RX) intermediate frequency (IF) signal 129 is filtered by a surface acoustic wave (SAW) bandpass filter 130 and then filtered again by a bandpass image filter 132. This filtered IF signal 133 is frequency down converted with another mixer 134, using a second LO signal 136 (discussed further below). The resulting second RX IF signal 135 is filtered by a lowpass filter 138 and amplified by an amplifier 140 having automatic gain control (AGC).

This filtered and amplified IF signal 141 is quadrature demodulated with two mixers 142, 144, using quadrature LO signals 147i, 147q provided by a divide-by-four (÷4) frequency divider 146 (discussed further below). The resulting in-phase 143 and quadrature-phase 145 data signals are then each amplified by amplifiers 148 and filtered by lowpass filters 150 prior to conversion to digital I and Q data by analog-to-digital converters (ADCs) 152. The demodulator LO signals 147i, 147q are derived from the aforementioned second LO signal 136 (discussed further below). This LO signal 136 is frequency divided by four with the ÷4 frequency divider 146. One output 147i is selected as the reference (e.g. 0°) output and is used for the I data channel. The other output 147q is the quadrature (e.g. −90°) output of the ÷4 frequency divider 146 and is used for the Q data channel.

Operation of the transmitter 106 can be described as follows. A transmitter (TX) VCO 154 generates a carrier signal 155 which is padded down by an attenuator 156 for application to a mixer 158 for frequency down conversion using the aforementioned RX VCO output 109. The resulting TX IF signal 159 is inputted to a single-pole, double-throw RF switch 160. When this switch 160 is in the receive position (RX), i.e. when the transceiver 100 is operating in the receive mode, the TX IF signal 159 is a continuous wave (CW) signal and serves as the aforementioned second LO signal 136 for the receiver 104. When the switch 160 is in the transmit position (TX), the TX IF signal 159 is multiplied in frequency by a frequency doubler (X2) 162. This frequency-multiplied signal 163 is filtered by a shunt band-stop filter 164 (e.g. high-Q resonant tank circuit) before being divided back down in frequency by a divide-by-two (÷2) frequency divider 166. The resulting frequency-divided signals 167i, 167q (equal in frequency to the TX IF signal 159) are inputted to two mixers 168, 170 for selective modulation by analog signals 173i, 173q provided by digital-to-analog converters (DACs) 172 and based upon quadrature, digital I and Q data. The resulting modulated signals 169, 171 are summed together in a signal adder 174 to produce a quadrature-modulated TX IF signal 175, which goes to one throw of a second single-pole, double-throw RF switch 176.

With the switch 176 operating in its transmit position (TX), the modulated TX IF signal 177 is selectively divided by a 9-bit, divide-by-N (÷N) counter 178. Meanwhile, a crystal-controlled oscillator 180 provides a reference signal 181 which is selectively divided in frequency by a 9-bit, divide-by-R (÷R) counter 182. These two frequency-divided signals 179, 183 are compared (with respect to signal phase) by a phase detector 184. The phase error signal 185 from the phase detector 184 drives a charge pump 186 whose output 187 is filtered by a loop filter 188. This lowpass filtered signal 189 serves as a the frequency and phase control signal for the TX VCO 154.

The now-modulated carrier signal 155 from the VCO 154 is filtered by a bandpass filter 190, amplified by a power amplifier (PA) 192 and filtered again by a lowpass harmonic filter 194. The resulting transmitter signal 195 is routed to the antenna 118 via the aforementioned signal routing device 120.

As noted above, the transceiver 100 operates in two modes: receive and transmit. When the transceiver 100 is operating in the receive mode, the receiver 104 operates as described above, and in accordance with a transmit/receive switch control signal 196 the two RF switches 160, 176 in the transmitter 106 are switched into their receive positions RX. This causes the quadrature modulator circuitry to be bypassed, thereby causing the TX VCO output 155 to be a CW signal, which in turn, allows the CW TX IF signal 159 to be used as the second LO signal 136 for the receiver 104, as discussed above.

When the transmitter 100 is operating in the transmit mode, the transmitter 106 operates as discussed above, and in accordance with the switch control signal 196 the RF switches 160, 176 are switched into their transmit positions TX. This allows the TX IF signal 159 to be quadrature modulated with I and Q data, as discussed above. The divide ratios for the counters 178, 182 are selectively programmed via a transmitter PLL control signal 198, as is the gain of the phase detector 184. (A more detailed discussion of the modulation synthesizer formed by the TX VCO 154, transmitter mixer 158, modulator mixers 168, 170, counters 178, 182, phase detector 184 and their associated interconnecting components can be found in the above-referenced parent application Ser. No. 08/163,671, the disclosure of which is incorporated herein by reference.)

Referring to FIG. 2, the transceiver 100 of FIG. 1 can be used advantageously as a transceiver for GSM and DCS 1800 systems. The three sets of suggested frequencies for each system are shown in the table, including the corresponding frequencies for the RX and TX IF signals, RX and TX VCO output signals and phase detector (PD), as well as the corresponding "R" and "N" divide ratios for the reference counter 182 and feedback counter 178, respectively. In accordance with the foregoing discussion, these suggested frequency plans work for GSM and DCS 1800 systems with slight extensions of the TX and RX VCO frequencies beyond the standard allocated bandwidths of 35 megahertz (MHz) and 75 MHz, respectively.

Based upon the foregoing, a number of observations can be made regarding the transceiver 100 of FIG. 1. The dual frequency down conversion used within the receiver 104 allows the automatic gain controlled amplifier 140 and quadrature modulator (mixers 142, 144) to operate at or below 100 MHz, instead of having to operate within a higher range of approximately 200–300 MHz as would be required for a single frequency down conversion design. This allows the automatic gain controlled amplifier 140 to operate with less power supply current. Further, since the first RX IF signal frequency is within the range of 200–300 MHz, the bandpass filter function following the first frequency down conversion (performed by mixer 128) can be realized much more easily with a SAW filter. Such a filter has a relatively low insertion loss in this frequency range (e.g. approximately 3 dB) and provides a high degree of selectivity and uniform group delay.

Further, the first RX IF signal frequency is 25% higher than (i.e. 5/4) the frequency of the second receiver LO signal 136. The reason for this ratio is that the aforementioned ÷4 frequency divider 146 is used to generate the LO signals 147i, 147q for the quadrature demodulator mixers 142, 144. By using such ÷4 frequency divider 146, the quadrature phase relationship of the frequency-divided LO signals 147i, 147q can be accurately maintained. By satisfying this 5/4 frequency ratio, the second receiver LO signal 136 can be used for both the second frequency down conversion in the second receiver mixer 134 and the quadrature demodulation via the demodulator mixers 142, 144.

Further still, when the transceiver 100 is operating in the transmit mode, a high phase detector 184 frequency is needed, due to the design requirements for the transmit loop filter 188 which must pass the bandwidth of the I and Q data modulation while attenuating unwanted harmonics of the phase detector signal (often referred to as "reference spurs"). The frequency of the crystal oscillator signal 181 is chosen so that a minimum divide ratio of three (3) is used in the reference divider 182 for the transmitter PLL. The feedback divide ratio in the feedback counter 178 and the TX IF signal frequency are chosen to match the divided-reference signal 183 frequency at the phase detector 184. This TX IF signal frequency must also be the difference between the RX VCO output 109 and TX VCO output 155 frequencies. As shown in the table of FIG. 2, the phase detector gain ($K_p$) is adjusted by a factor of four (4) so as to maintain a constant open loop gain despite the changes in the phase detector frequency.

It should be understood that various alternatives to the embodiments of the present invention described herein can be employed in practicing the present invention and will be apparent to those skilled in the art without departing from the scope and spirit of this invention. It is intended that the following claims define the scope of the present invention, and that structures and methods within the scope of these claims and their equivalents be covered thereby.

What is claimed is:

1. A radio frequency (RF) transceiver for modulating and demodulating RF signals, said transceiver comprising:

a first local oscillator for providing a first local oscillator (LO) signal;

a dual conversion receiver, coupled to said first local oscillator, for receiving said first LO signal and a second LO signal and in accordance therewith frequency converting and demodulating an incoming modulated RF signal, wherein said frequency converting is done with said first and second LO signals and said demodulating is done with said second LO signal; and a transmitter, coupled to said first local oscillator and said dual conversion receiver and including a second local oscillator, for receiving said first LO signal, a reference signal and a mode control signal and in accordance therewith generating and providing said second LO signal, and further for receiving said first LO signal, said reference signal, said mode control signal and at least one modulation signal and in accordance therewith generating and modulating said second LO signal for providing an outgoing modulated RF signal.

2. A transceiver as recited in claim 1, wherein said first local oscillator comprises a phase lock loop (PLL).

3. A transceiver as recited in claim 1, wherein said dual conversion receiver comprises:

a dual frequency converter for frequency converting said incoming modulated RF signal with said first LO signal to produce a first modulated intermediate frequency (IF) signal and for frequency converting said first modulated IF signal with said second LO signal to produce a second modulated IF signal; and a demodulator, coupled to said dual frequency converter, for receiving said second LO signal and in accordance therewith demodulating said second modulated IF signal.

4. A transceiver as recited in claim 3, wherein said dual frequency converter comprises a plurality of serially coupled mixers.

5. A transceiver as recited in claim 3, wherein said demodulator comprises a quadrature demodulator.

6. A transceiver as recited in claim 5, wherein said demodulator further comprises a frequency divider, coupled to said quadrature demodulator, for frequency dividing said second LO signal for use by said quadrature demodulator.

7. A transceiver as recited in claim 1, wherein said transmitter comprises a feedback-modulated PLL.

8. A transceiver as recited in claim 1, wherein said transmitter comprises a modulated frequency synthesizer.

9. A transceiver as recited in claim 1, wherein said carrier generator comprises a voltage-controlled oscillator (VCO).

10. A transceiver as recited in claim 1, wherein said frequency converter comprises a mixer.

11. A transceiver as recited in claim 1, wherein said modulator comprises a quadrature modulator.

12. A transceiver as recited in claim 1, wherein said controller comprises a phase detector.

13. A transceiver as recited in claim 1, wherein said switchable coupler comprises a plurality of signal switches.

14. A radio frequency (RF) transceiver for modulating and demodulating RF signals with a direct modulation transmitter and a dual intermediate frequency (IF) receiver, respectively, said transceiver comprising:

a local oscillator for providing a first local oscillator (LO) signal;

a first frequency converter, coupled to said local oscillator, for receiving said first LO signal and for receiving and frequency converting therewith an incoming modulated RF signal to provide a first modulated IF signal;

a second frequency converter, coupled to said first frequency converter, for receiving a second LO signal and for receiving and frequency converting therewith said first modulated IF signal to provide a second modulated IF signal;

a demodulator, coupled to said second frequency converter, for receiving said second LO signal and for receiving and demodulating therewith said second modulated IF signal;

a carrier generator for receiving a transmitter control signal and in accordance therewith generating a transmitter carrier signal;

a third frequency converter, coupled to said carrier generator and said local oscillator, for receiving said transmitter carrier signal and said first LO signal and in response thereto providing said second LO signal;

a modulator for selectively receiving and modulating said second LO signal to provide a third modulated IF signal;

a controller, coupled to said carrier generator, for receiving a reference signal and selectively receiving said second LO signal and said third modulated IF signal and in response thereto providing said transmitter control signal; and a switchable coupler for receiving a mode control signal and in response thereto coupling said controller to said third frequency converter and coupling said modulator to said third frequency converter and to said controller.

15. A transceiver as recited in claim 14, wherein said carrier generator, said third frequency converter, said modulator and said controller together form a feedback-modulated phase lock loop (PLL).

16. A transceiver as recited in claim 14, wherein said carrier generator, said third frequency converter, said modulator and said controller together form a modulated frequency synthesizer.

17. A transceiver as recited in claim 14, wherein said local oscillator comprises a PLL.

18. A transceiver as recited in claim 14, wherein said first frequency converter comprises a mixer.

19. A transceiver as recited in claim 14, wherein said second frequency converter comprises a mixer.

20. A transceiver as recited in claim 14, wherein said demodulator comprises a quadrature demodulator.

21. A transceiver as recited in claim 20, wherein said demodulator further comprises a frequency divider, coupled to said quadrature demodulator, for frequency dividing said second LO signal for use by said quadrature demodulator.

22. A transceiver as recited in claim 14, wherein said carrier generator comprises a voltage-controlled oscillator (VCO).

23. A transceiver as recited in claim 14, wherein said third frequency converter comprises a mixer.

24. A transceiver as recited in claim 14, wherein said modulator comprises a quadrature modulator.

25. A transceiver as recited in claim 14, wherein said controller comprises a phase detector.

26. A transceiver as recited in claim 14, wherein said switchable coupler comprises a plurality of signal switches.

27. A method for modulating and demodulating RF signals by direct transmission modulation and dual intermediate frequency (IF) reception, respectively, said method comprising the steps of:

providing a first local oscillator (LO) signal;

receiving an incoming modulated RF signal;

frequency converting said incoming modulated RF signal with said first LO signal to provide a first modulated IF signal;

receiving a transmitter control signal and in accordance therewith generating a transmitter carrier signal;

receiving said transmitter carrier signal and said first LO signal and in response thereto providing a second LO signal;

frequency converting said first modulated IF signal with said second LO signal to provide a second modulated IF signal;

demodulating said second modulated IF signal with said second LO signal;

receiving a reference signal;

receiving a mode control signal which includes a plurality of signal states;

in response to a first one of said plurality of mode control signal states, providing said transmitter control signal in accordance with said reference signal and said second LO signal; and in response to a second one of said plurality of mode control signal states:

modulating said second LO signal to provide a third modulated IF signal; and providing said transmitter control signal in accordance with said reference signal and said third modulated IF signal, whereby said transmitter carrier signal forms an outgoing modulated RF signal.

28. A method as recited in claim 27, wherein said step of receiving a transmitter control signal and in accordance therewith generating a transmitter carrier signal comprises receiving a phase lock loop (PLL) oscillator control signal.

29. A method as recited in claim 27, wherein said step of receiving said transmitter carrier signal and said first LO signal and in response thereto providing said second LO signal comprises mixing said transmitter carrier signal and said first LO signal.

30. A method as recited in claim 27, wherein said step of demodulating said second modulated IF signal with said second LO signal comprises quadrature demodulating said second modulated IF signal.

31. A method as recited in claim 30, wherein said step of demodulating said second modulated IF signal with said second LO signal further comprises frequency dividing said second LO signal for use in said quadrature demodulating of said second modulated IF signal.

32. A method as recited in claim 27, wherein said step of providing said transmitter control signal in accordance with said reference signal and said second LO signal comprises phase locking said transmitter carrier signal to said reference signal.

33. A method as recited in claim 27, wherein said step of modulating said second LO signal to provide said third modulated IF signal comprises quadrature modulating said second LO signal.

34. A method as recited in claim 27, wherein said step of providing said transmitter control signal in accordance with said reference signal and said third modulated IF signal comprises phase locking said transmitter carrier signal to said reference signal.

35. A method for modulating and demodulating RF signals by direct transmission modulation and dual intermediate frequency (IF) reception, respectively, said method comprising the steps of:

receiving a reference signal;

receiving a mode control signal which includes a plurality of signal states;

providing a first local oscillator (LO) signal;

in response to a first one of said plurality of mode control signal states:

receiving an incoming modulated RF signal;

frequency converting said incoming modulated RF signal with said first LO signal to provide a first modulated IF signal;

receiving a transmitter control signal and in accordance therewith generating a transmitter carrier signal;

receiving said transmitter carrier signal and said first LO signal and in response thereto providing a second LO signal;

frequency converting said first modulated IF signal with said second LO signal to provide a second modulated IF signal;

demodulating said second modulated IF signal with said second LO signal;

providing said transmitter control signal in accordance with said reference signal and said second LO signal; and in response to a second one of said plurality of mode control signal states:

receiving said transmitter control signal and in accordance therewith generating said transmitter carrier signal;

receiving said transmitter carrier signal and said first LO signal and in response thereto providing said second LO signal;

modulating said second LO signal to provide a third modulated IF signal; and providing said transmitter control signal in accordance with said reference signal and said third modulated IF signal, whereby said transmitter carrier signal forms an outgoing modulated RF signal.

36. A method as recited in claim 35, wherein said steps of receiving said transmitter control signal and in accordance therewith generating said transmitter carrier signal each comprises receiving a phase lock loop (PLL) oscillator control signal.

37. A method as recited in claim 35, wherein said steps of receiving said transmitter carrier signal and said first LO signal and in response thereto providing said second LO signal each comprises mixing said transmitter carrier signal and said first LO signal.

38. A method as recited in claim 35, wherein said step of demodulating said second modulated IF signal with said second LO signal comprises quadrature demodulating said second modulated IF signal.

39. A method as recited in claim 38, wherein said step of demodulating said second modulated IF signal with said second LO signal further comprises frequency dividing said second LO signal for use in said quadrature demodulating of said second modulated IF signal.

40. A method as recited in claim 35, wherein said step of providing said transmitter control signal in accordance with said reference signal and said second LO signal comprises phase locking said transmitter carrier signal to said reference signal.

41. A method as recited in claim 35, wherein said step of modulating said second LO signal to provide said third modulated IF signal comprises quadrature modulating said second LO signal.

42. A method as recited in claim 35, wherein said step of providing said transmitter control signal in accordance with said reference signal and said third modulated IF signal comprises phase locking said transmitter carrier signal to said reference signal.

43. A radio frequency (RF) transceiver for modulating and demodulating RF signals, said transceiver comprising:

a local oscillator for providing a first local oscillator (LO) signal;

a dual conversion receiver, coupled to said local oscillator, for receiving said first LO signal and a second LO signal and in accordance therewith frequency convening and demodulating an incoming modulated RF signal; and a transmitter, coupled to said local oscillator and said dual conversion receiver, for receiving said first LO signal, a reference signal and a mode control signal and in accordance therewith providing said second LO signal, and further for receiving said first LO signal, said reference signal, said mode control signal and at least one modulation signal and in accordance therewith providing an outgoing modulated RF signal, wherein said modulated transmitter comprises:

a carrier generator for receiving a transmitter control signal and in accordance therewith generating a transmitter carrier signal;

a frequency converter, coupled to said carrier generator, for receiving said transmitter carrier signal and said first LO signal and in response thereto providing said second LO signal;

a modulator for selectively receiving and modulating said second LO signal to provide a third modulated IF signal;

a controller, coupled to said carrier generator, for receiving said reference signal and selectively receiving said second LO signal and said third modulated IF signal and in response thereto providing said transmitter control signal; and a switchable coupler for receiving said mode control signal and in response thereto coupling said controller to said frequency converter and coupling said modulator to said frequency converter and to said controller.

* * * * *

UNITED STATES PATENT AND TRADEMARK OFFICE
CERTIFICATE OF CORRECTION

PATENT NO. : 5,511,236
DATED : April 23, 1996
INVENTOR(S) : Ruth Umstattd, et al.

It is certified that error appears in the above-indentified patent and that said Letters Patent is hereby corrected as shown below:

In Col. 5, line 60, delete "1" and replace with --43--.
In Col. 5, line 62, delete "1" and replace with --43--.
In Col. 5, line 64, delete "1" and replace with --43--.
In Col. 5, line 66, delete "1" and replace with --43--.
In Col. 6, iine 1, delete "1" and replace with --43--.
In Col. 9, lines 23-24, after "frequency", delete "convening" and replace with --converting--.

Signed and Sealed this

Sixteenth Day of July, 1996

Attest:

BRUCE LEHMAN

Attesting Officer          Commissioner of Patents and Trademarks